(12) United States Patent
Nitta et al.

(10) Patent No.: US 10,192,781 B2
(45) Date of Patent: Jan. 29, 2019

(54) INTERCONNECT STRUCTURES INCORPORATING AIR GAP SPACERS

(71) Applicant: International Business Machines Corporation, Armonk, NY (US)

(72) Inventors: Satya V. Nitta, Armonk, NY (US); Shom Ponoth, Armonk, NY (US)

(73) Assignee: International Business Machines Corporation, Armonk, NY (US)

(*) Notice: Subject to any disclaimer, the term of this patent is extended or adjusted under 35 U.S.C. 154(b) by 261 days.

(21) Appl. No.: 15/055,451

(22) Filed: Feb. 26, 2016

(65) Prior Publication Data
US 2016/0181144 A1 Jun. 23, 2016

Related U.S. Application Data

(60) Continuation of application No. 14/846,803, filed on Sep. 6, 2015, now Pat. No. 9,704,741, which is a continuation of application No. 13/083,550, filed on Apr. 9, 2011, now Pat. No. 9,305,882, which is a division of application No. 11/855,211, filed on Sep. 14, 2007, now abandoned.

(51) Int. Cl.
| | |
|---|---|
| *H01L 21/4763* | (2006.01) |
| *H01L 21/768* | (2006.01) |
| *G01H 11/06* | (2006.01) |
| *G01H 3/00* | (2006.01) |
| *G01H 11/00* | (2006.01) |
| *H01L 21/311* | (2006.01) |
| *G01H 11/02* | (2006.01) |

(52) U.S. Cl.
CPC ........... *H01L 21/7682* (2013.01); *G01H 3/00* (2013.01); *G01H 11/00* (2013.01); *G01H 11/06* (2013.01); *H01L 21/31111* (2013.01); *H01L 21/76802* (2013.01); *H01L 21/76807* (2013.01); *H01L 21/76826* (2013.01); *H01L 21/76829* (2013.01); *H01L 21/76834* (2013.01); *H01L 21/76843* (2013.01); *H01L 21/76877* (2013.01); *G01H 11/02* (2013.01)

(58) Field of Classification Search
CPC ......... H01L 21/76802; H01L 21/76807; H01L 21/7682; H01L 21/76829; H01L 21/76834
USPC .......................... 438/629, 637, 639, 672, 675
See application file for complete search history.

(56) References Cited

U.S. PATENT DOCUMENTS

| | | | | |
|---|---|---|---|---|
| 2004/0099951 A1* | 5/2004 | Park | ...................... | B81B 7/0006 257/758 |
| 2006/0073695 A1* | 4/2006 | Filippi | .............. | H01L 21/76807 438/619 |
| 2008/0182405 A1* | 7/2008 | Liu | .................. | H01L 21/76807 438/623 |

\* cited by examiner

*Primary Examiner* — Matthew E Warren

(57) ABSTRACT

A dual damascene article of manufacture comprises a trench containing a conductive metal column where the trench and the conductive metal column extend down into and are contiguous with a via. The trench and the conductive metal column and the via have a common axis. These articles comprise interconnect structures incorporating air-gap spacers containing metal/insulator structures for Very Large Scale Integrated (VLSI) and Ultra Large Scale Integrated (ULSI) devices and packaging. The trench in this regard comprises a sidewall air-gap immediately adjacent the side walls of the trench and the conductive metal column, the sidewall air-gap extending down to the via to a depth below a line fixed by the bottom of the trench, and continues downward in the via for a distance of from about 1 Angstrom below the line to the full depth of the via. In another aspect, the article of manufacture comprises a capped dual damascene structure.

11 Claims, 5 Drawing Sheets

INTERCONNECT STRUCTURES INCORPORATING AIR GAP SPACERS

RELATED APPLICATIONS

The present application is a Continuation Application of U.S. patent application Ser. No. 14/846,801, filed September 6, which is a Continuation Application of U.S. patent application Ser. No. 13/083,550, filed April 9, which is a Divisional Application of U.S. patent application Ser. No. 11/855,211, filed September 14, the contents of all of which are incorporated herein by reference in their entirety.

FIELD OF THE INVENTION

The field of the invention comprises semiconductor device manufacturing and more specifically to methods of forming air-gap containing metal/insulator interconnect structures for Very Large Scale Integrated (VLSI) and Ultra Large Scale Integrated (ULSI) devices and packaging.

BACKGROUND OF THE INVENTION

Device interconnections in Very Large Scale Integrated (VLSI) or Ultra-Large Scale Integrated (ULSI) semiconductor chips typically have multilevel structures containing patterns of metal wiring layers encapsulated in an insulator. Wiring structures within a given level of wiring are separated by an intra level dielectric, while the individual wiring levels are separated from each other by layers of an inter level dielectric, Conductive vias are formed in the inter level dielectric to provide inter level contacts between the wiring traces.

Because of their effects on signal propagation delays, the materials and layout of these interconnect structures can substantially impact chip speed, and thus chip performance. Signal-propagation delays are due to RC time constants wherein "R" is the resistance of the on-chip wiring, and "C" is the effective capacitance between the signal lines and the surrounding conductors in the multilevel interconnection stack. RC time constants are reduced by lowering the specific resistance of the wiring material, and by using inter level and intra level dielectrics (ILDs) with lower dielectric constants, k.

The common terminology used to classify ILDs by their dielectric constant falls into four categories: standard k (4.5 k<10), low k (k<3.0), ultra low k (2.0 k<<2.5), and extreme low k (k<2.0). Ultra low k and extreme low k dielectrics generally tend to be porous with intentionally engineered voids in their structure. Since the lowest dielectric constant possible comprises air or vacuum ($k_{vac}$=1) the industry has developed means to produce voids in the dielectric. When the void volume extends and occupies substantial contiguous regions of the gaps between the lines of wires of a chip device, one achieves an interconnect structure where these lines are nominally separated by air or vacuum as the ILD material. We employ the term "air bridge" to describe such an interconnect structure to distinguish it from structures which employ a porous ILD with void volume dispersed randomly within a nominally contiguous solid dielectric.

An example of a metal/dielectric combination for low RC interconnect structures comprises copper metal with a dielectric such as $SiO_2$ (k~4.0). Due to difficulties in subtractively patterning copper, copper-containing interconnect structures are typically fabricated by a damascene process. In a typical damascene process, conductive metal patterns, which are inset in a layer of dielectric, are formed by the steps of: (i) etching holes (for vias) or trenches (for wiring) into the inter level or intra level dielectric; (ii) optionally, lining the holes or trenches with one or more adhesion or diffusion barrier layers; (iii) overfilling the holes or trenches with a conductive metal wiring material such as copper, although other metals may be used in this regard such as aluminum, gold, silver, tin, alloys thereof and combinations thereof including combinations with copper and alloys of copper. This is followed by step (iv), removing the metal overfill by a planarizing process such as chemical-mechanical polishing (CMP), leaving the metal even with the upper surface of the dielectric.

Commercial processes can repeat these steps until the desired number of wiring and via levels have been fabricated. Fabrication of interconnect structures by damascene processing can be substantially simplified by using a process variation known as dual damascene, in which patterned cavities for the wiring level and its underlying via level are filled in with metal in the same deposition step. Dual damascene reduces the number of metal polishing steps by a factor of two, providing substantial cost savings, but requires introduction of a dual-relief pattern in the combined via and wiring level dielectric.

In a typical DD process, an inter-metal dielectric (IMD) is coated on a substrate and comprises a via level dielectric and line level dielectric. These two layers can be made of the same or different insulating films and in the former case applied as a single monolithic layer. A hard mask layer or a layered stack is optionally employed to facilitate etch selectivity and to serve as a polish stop. The wiring interconnect network consists of two types of features: line features that traverse a distance across the chip, and the via features which connect lines in different levels of interconnects in a multilevel stack together. Historically, both layers are made from an inorganic glass like silicon dioxide ($SiO_2$) or a fluorinated silica glass (FSG) film deposited by plasma enhanced chemical vapor deposition (PECVD).

Wolf, "Introduction to Dual-Damascene Processes," *Silicon Processing For the VLSI Era*, Vol. 4, pp. 674-79, Lattice Press (2004); Yen et al., U.S. Pat. No. 5,801,094; Wang et al. WO 2004/053948 A3; Woo, U.S. Pat. No. 7,015,149; Colburn, U.S. Pat. No. 7,071,097; and Gambino, et al., United States Patent Publication 20060172514, Aug. 3, 2006 also describe dual damascene processes.

Low-k alternatives to $SiO_2$ comprise carbon-based solid materials such as diamond-like carbon (DLC), also known as amorphous hydrogenated carbon (a-C:H), fluorinated DLC (FDLC), SiCO or SiCOH compounds, and organic or inorganic polymer dielectrics. Nanoporous versions of $SiO_2$ and the above-mentioned carbon-based materials have even lower k values, while air-gaps have the lowest k values of any material (k~1.00). (Note that the air in the air-gap may comprise any gaseous material or vacuum.) Havemann, et al, U.S. Pat. No. 5,461,003; Grill, et al., U.S. Pat. No. 5,869,880; and Chang, et al. U.S. Pat. No. 5,559,055 describe multilayer interconnect structures incorporating air-gaps. Additionally, Wang et al. WO 2004/053948 A3 and Colburn et al. U.S. Pat. No. 6,930,034 describe methods of placing air-gaps or "air bridges" in a semiconductor chip, or semiconductor array, or wafer, or integrated circuit (IC) components.

One prior art method for forming air-gaps utilizes a sacrificial place-holder (SPH) material which is removed or extracted from beneath a solid or semi-permeable bridge layer. Examples of SPH materials and removal methods comprise poly (methylmethacrylate) (PMMA), poly-para-xylylene (Parylene™), amorphous carbon, and polystyrene, which may be removed by organic solvents, oxygen ashing, and/or low temperature (~200° C.) oxidation, and norbornene-based materials such as BF Goodrich's Unity Sacrificial Polymer™, which may be removed by low temperature (350°-400° C.) thermal decomposition into volatiles. In the case of the Unity material, the volatile decomposition by-product actually diffuses through the bridge layer, as demonstrated by Kohl et al., Electrochemical and Solid-State Letters 1 49 (1998) for structures comprising $SiO_2$ (500 nm) bridge layers deposited by a low temperature plasma enhanced chemical vapor deposition (PECVD) process.

In all these cases, the removal medium, (plasma, a wet chemical, or SPH material), is required to diffuse through the semi-permeable bridge layer. This is generally very difficult to achieve.

Lee et al., U.S. Pat. No. 6,228,763 teach the use of spacers to form air-gaps adjacent to metal structures in an interconnect scheme. However, in their structure, they claim that the nature of their scheme ensures that the metal structure is curved outward since it closely follows the contours of the spacer. This is an undesirable structure since it could lead to high field concentrations around the curved parts and poor breakdown behavior of the interconnect, a significant drawback. In addition, they propose the use of a single damascene scheme to form their structure. This makes their scheme very expensive and limits the performance due to their inability to extend the air-gap below the trench to obtained increased performance. Finally, in their scheme, they use plasma based methods to remove the dielectric spacer to form the air-gap and they do this with the metal interconnect already present in the structure which could lead to a degradation of the conductive properties of the interconnect.

Lee et al., U.S. Pat. No. 6,329,279 solve one of the problems they encounter in U.S. Pat. No. 6,228,763, namely the high field concentrations around the curved parts of the top of the metal line by means of a new structure; however, their gap is narrowest adjacent to the top of the metal line where it is most desirable to reduce the dielectric constant due to the presence of the relatively high k barrier layer immediately above it. The other drawbacks mentioned above for U.S. Pat. No. 6,228,763 still remain, the chief of which is that this is based on a single damascene integration scheme which is prohibitively expensive, limited in performance, and not extendible readily to any interconnect scheme in the industry which uses Cu based metallurgy.

Geffken et al., United States Patent Publication 2005/0067673 A1, also teach a method to obtain air-gaps, but indicate a drawback by noting "that since these second spacers have reduced the size of the trench openings 56, 58 and via openings 52, 54, then initially formed, the trench and via photo needs to be exposed and etched larger by about two times the spacer width." (Geffken et al. par. [0025]). This is very difficult to achieve, especially as the structure gets closer to the tens of nanometer dimensions because this calls for a lithography process where the pitch remains the same but the openings are enlarged by twice the spacer width which makes the lithography process difficult to employ. In addition, due to the lack of a gap below the trench and adjacent to the vias, their performance gain is limited. Finally, since their invention calls for an extra lithography step, in addition to extra wet/SC CO2 etches to remove the damaged dielectric, it is very expensive to practice.

Another concern with air-gap based dielectric structures compared to structures with solid dielectrics is that air-gap based structures have lower thermal conductivity, reduced strength, and higher permeability to moisture and oxygen. Workable schemes for incorporating air-gaps into interconnect structures must take these limitations into account.

In addition structures with air-gaps may not be as uniformly planar as structures built with intrinsically more rigid solid dielectrics. This can be a problem if locally depressed areas are formed by bridge layer sag over unsupported air-gaps, since metal filling these depressed areas will remain in the structure after chemical-mechanical polishing (CMP) and be a source of shorts and/or extra capacitance.

In view of these drawbacks with the prior art processes, there is a continued need for developing a new and improved method by which air-gaps can be formed in an interconnect to minimize or eliminate these problems.

While all of the foregoing provide advancements in the fabrication of air-gaps in semiconductor chips or semiconductor arrays or wafers or IC circuits, collectively referred to hereafter as electronic devices, there is still a need for improved or novel processes, articles of manufacture and products produced by novel processes that provide air-gap structures that eliminate or minimize these and other problems encountered in the art.

SUMMARY OF THE INVENTION

The present invention provides materials and a process or processes for forming an air-gap or air-gaps in electronic devices as described herein, as well as a product produced by such process or processes or articles of manufacture that address these needs, and not only provides advantages over the prior art, but also substantially obviates one or more of the foregoing and other limitations and disadvantages of the prior art.

The written description, abstract of the disclosure, claims, and drawings of the invention as originally set out herein, or as subsequently amended, set forth the features and advantages and objects of the invention, and point out how they may be realized and obtained. Additional objects and advantages of the invention may be learned by practice of the invention.

To achieve these and other advantages and objectives, and in accordance with the purpose of the invention as embodied and described herein, the invention comprises a process for providing air-gaps in an electronic device, a product produced by the process and an article of manufacture comprising such a device according to the written description that follows, the claims, and the Abstract of the Disclosure, and as illustrated in the attached drawings.

In one aspect, the present invention comprises semiconductor device manufacturing and more specifically to methods of forming air-gap containing metal/insulator interconnect structures for Very Large Scale Integrated (VLSI) and Ultra Large Scale Integrated (ULSI) devices and packaging, wherein air-gap spacers, also referred to as sidewall air-gaps in this specification and drawings, are formed in such structures by removing intentionally damaged dielectric material using selective chemical etch means.

The present invention provides a process sequence which will enable formation of self-aligned, spacer-like air-gap interconnect structures. In one embodiment, we start with a silica or organosilicate containing dielectric structure. We carry out the "via-first" dual-damascene etch scheme until the trench etch step. Wolf, "Introduction to Dual-Damascene Processes," *Silicon Processing For the VLSI Era*, Vol. 4, pp. 674-79, Lattice Press (2004) and the other dual damascene prior art we cite herein describe the via first dual damascene process Other dual damascene processes that we employ comprise, the Trench-First, Via-First, and Self-Aligned Dual Damascene processes that Wolf summarizes, and the prior art describes. This invention involves intentionally damaging the dielectric during an "ashing" step and/or the step in which the organic planarizing layer is removed and before a "cap-open" step in which the underlying cap layer is opened. The extent of the damage to the ILD can be controlled by varying etch parameters during the ashing step. Unlike conventional processes, this damaged layer is left in place after etch and is followed by metallization and chemical mechanical planarization (CMP). Subsequent to this, the stack is exposed to a selective etch step such as a dilute HF dip, during which the damaged ILD is removed, leaving behind air-gap structures. The first embodiment relates to cases in which the air-gap width is small enough such that the subsequent cap deposition pinches off leaving behind an air-spacer. The air-gap widths referred to in this embodiment range from about a few nm to less than about 50 nm.

For damaged ILD widths of approximately >30 nm, for which the likelihood of subsequent cap deposition filling the air-gap created after the selective etch is high, we propose a second embodiment of the present invention. The relevant air-width could range from about 30 nm and larger. However, the exact limits depend on the cap deposition method and would be obvious to those skilled in the art. In the second embodiment, the cap layer is deposited following CMP. Perforations are made in the cap layer either by using an optical mask or by using a random self-assembled scheme as outlined by Colburn et al., U.S. Pat. No. 6,911,400. The size of the perforations are such they are big enough for the extraction of the damaged ILD and small enough such that pinch off occurs during cap or next level ILD deposition. The range of the cap perforations can range from, but not limited to, about 10 nm to about 80 nm. The extraction of the damaged ILD is done subsequent to this perforation step. This is followed by the deposition of a second cap layer during which the small perforations facilitates a quick pinch off hence preventing deposition of the cap material inside the air-gaps.

BRIEF DESCRIPTION OF THE DRAWINGS

The features of the invention believed to be novel and the elements characteristic of the invention are set forth with particularity in the written description and claims. The accompanying drawings, incorporated in and which constitute a part of this specification, illustrate single and multiple embodiments of the invention, and together with the other parts of the specification, serve to explain the objects, advantages and principles of the invention. The drawings present figures that are not necessarily drawn to scale. The invention itself, both as to organization and method of operation, may be understood by reference to the written description that follows taken in conjunction with the accompanying drawings in which:

FIGS. 2-7 comprise side elevations in cross section of the process sequence for the formation of the air-gap structures illustrated in the FIG. 1 embodiment of the present invention, wherein:

FIGS. 8-10 comprise side elevations in cross-section of the process sequence for the formation of the air-gap structures described in a second embodiment of the present invention wherein:

DETAILED DESCRIPTION OF THE INVENTION

Figure 1:
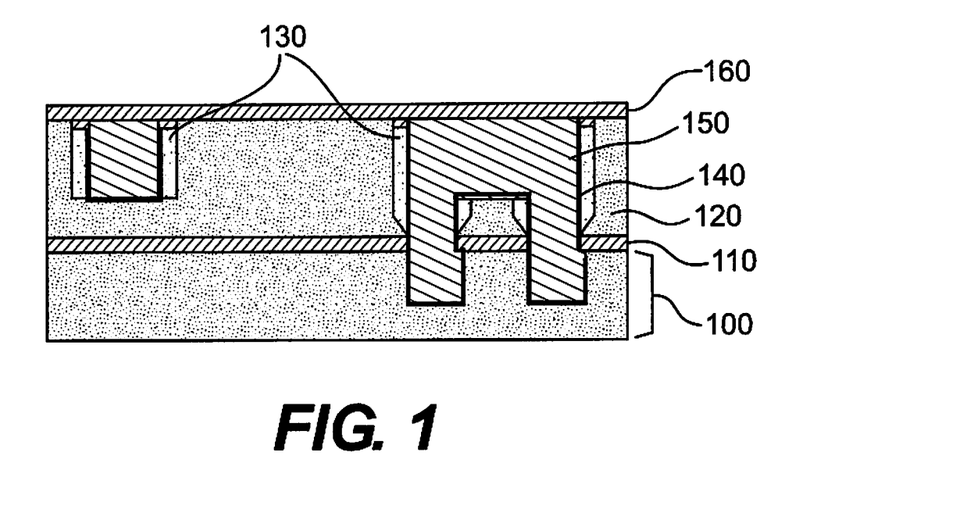
FIG. 1 comprises a side elevation in cross section of an embodiment of the spacer-like, air-gap based interconnect structure of the present invention.

The process sequence used to generate the interconnect structures with air-gap spacers is described with reference to the accompanying drawings. FIG. 1 shows a schematic cross section view of the proposed air-gap interconnect structure, the left side of FIG. 1 illustrating the placement of a trench and the right side, the placement of a combined or stacked trench and via contiguous to one another and having a common axis, with the trench configuration comprising the top of the structure and the via at the bottom. A two level structure is shown with 100 representing an underlying build with a dielectric material 120. A cap layer, 110, is deposited on this level and a dual damascene interconnect build with air-gap spacers is shown. The structure is comprised of the following: 120 is the dielectric material and is a porous or dense material comprised of silica or an organosilicate. The air-gaps are represented by 130 and depending on the metal structure may be limited to the line level or bottom of the trench or may extend all the way to the cap 110 underlying the via. The terms "air-gaps spacers" and "sidewall air-gaps" are used interchangeably in this specification. The metallization is represented by 140 which is a liner material and 150 is copper or any appropriate conductive metal. 160 represent the cap layer and this may partially fill the air-gap as seen in FIG. 1. The various elements of FIG. 1 also carry over to the other Figures of this invention, and such Figures also employ the same numbering of the elements used to describe the elements of FIG. 1. For example, the sidewall air-gap element 130 of FIG. 1 also denotes a sidewall air-gap element 130 in the other Figures of this invention, and likewise for the other elements in the Figures of this invention.

The following describes the process sequence used to fabricate the structure depicted in FIG. 1 and also describes a second or alternate embodiment. It should be noted we claim inter alia the structure in FIG. 1. and the process-sequence described below is an example of how we obtain the novel structure. In addition, depending on the specifics of the processes used, alternate structures will result, where the air-gaps 130 will have different shapes.

Figure 2:
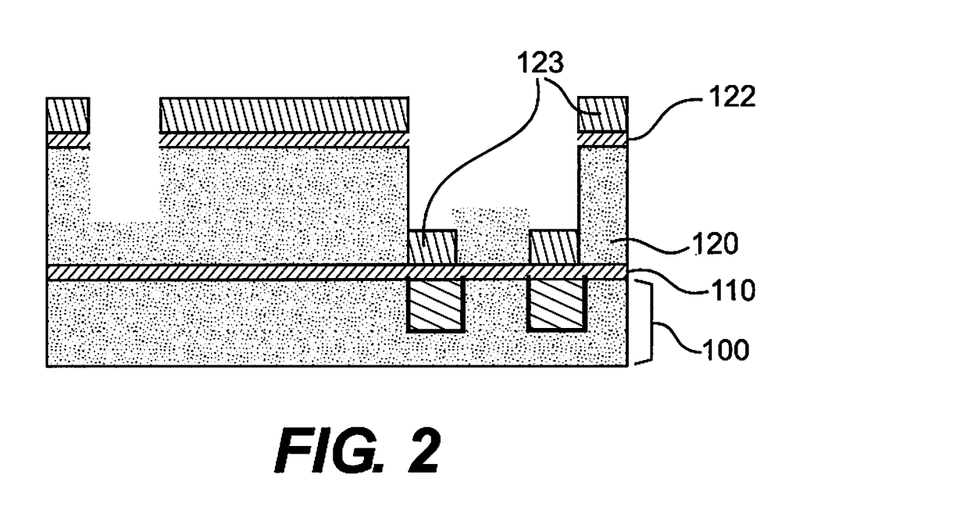
FIG. 2 comprises an the article of manufacture after trench opening the article of FIG. 1 and before ashing an organic planarizing layer for a "via first" dual damascene process according to the present invention.

FIG. 2 represents one of the final stages of the via-first dual damascene etch. The steps required to obtain this structure are well documented in the literature and prior art. Here we show the dual damascene process after the trench etch and just before the organic layer ash/strip that is the starting point of our invention. Element 123 is an organic planarizing layer. The via-first scheme described in the prior art employs an ash step to remove the residual organic layer, 123. Great care is taken to minimize damage to the ILD, 120. However, in our invention we diverge from the prior art and intentionally damage the ILD using appropriate ash chemistry. Element 122 is the etch hard mask and is typically a silicon oxide like material.

Figure 3:
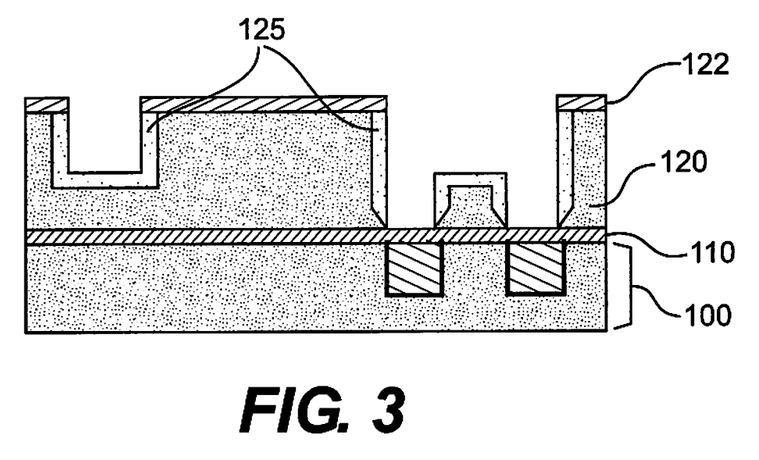
FIG. 3. comprises an article of manufacture showing intentional damage to the ILD of the article of FIG. 2 during an ash step, according to the present invention.

The structure after the ash step is shown in FIG. 3. Element 125 represents the damaged ILD. The organic planarizing layer may also be removed in this step. By damage, we are mainly alluding to removal of the organic parts of the ILD material. Hence, the nature of the damage is essentially chemical in nature and the damaged regions would maintain their physical structure. Example of ashing chemistries which would cause carbon depletion, i.e. chemical damage to the ILD, comprise $O_2/Ar$, $He/H_2$ among others, and combinations thereof. Such choices of the gas chemistries and process condition will be obvious to those skilled in the art. Basically, these ashing or damage chemistries comprise either oxidation or reduction reactions and combinations thereof. The extent and the profile of the chemical damage can be controlled by choice and process conditions of the ash chemistry. Porous ILDs are the preferable dielectric for this invention due the greater possible depth of damage as compared to dense ILDs. For silica or porous silica based ILD, the structure can be exposed to a process that would physically damage or strain the material hence essentially producing a layer 125 that has a substantially faster etch rate in the medium that is described later. In these cases the damage could be physical, chemical or a combination of both. An example of these damaging processes includes exposure to high energy plasma processes.

Figure 4:
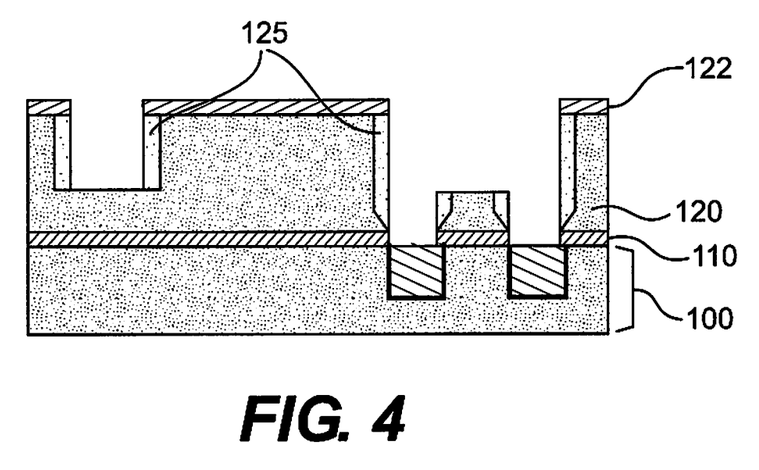
FIG. 4. comprises an article of manufacture showing a post cap open step applied to the article of FIG. 3, according to the present invention.

The strip step is usually designed to be selective to the underlying cap layer. This is followed with a cap open chemistry that can etch the damaged ILD, 125, in the horizontal areas and also provide contact to the underlying metal level by etching exposed areas of cap layer 110. The structure after this step is shown in FIG. 4. Note that the trench increases in this step and this increase should be accounted for in the initial trench etch so that target dimensions are achieved.

Figure 5:
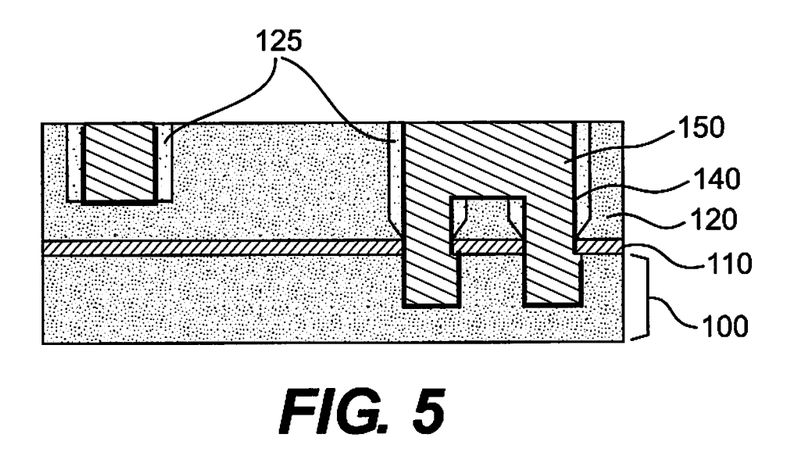
FIG. 5. comprises an article of manufacture showing a structure after metallization and planarization of the article of FIG. 4, according to the present invention.

This is followed by liner and seed deposition, copper plating and chemical-mechanical planarization to obtain the structure shown in FIG. 5. Element 140 is the liner and 150 represents the copper fill. The vertical damaged ILD regions, 125, are still part of the structure.

Figure 6:
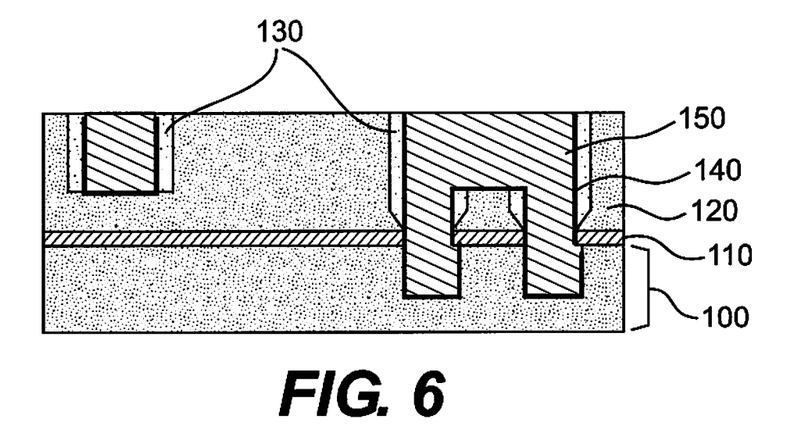
FIG. 6. comprises an article of manufacture showing air-gap formation by selective removal of damaged regions of the article of FIG. 5, according to the present invention.

This is followed with a wet extraction step to remove the damaged ILD regions resulting in an air-gap. Examples of the wet chemistries that can be used include dilute hydrofluoric acid (DHF) and ammonium hydroxide. The resultant structure is shown in FIG. 6. Elements 130 are the air-gaps that are formed after the removal of the damaged regions 125 seen in FIG. 5.

Figure 7:
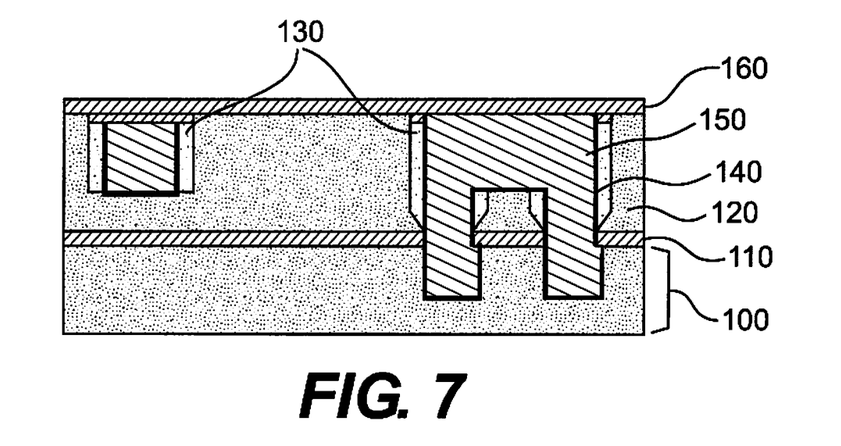
FIG. 7. comprises an article of manufacture showing a final structure comprising the capped structure of FIG. 6, demonstrating a single dual damascene build by means of the process of the first embodiment according to the present invention.

This is followed by the next level cap deposition, 160, and is shown in FIG. 7. In this embodiment of the invention the air-gaps are to be narrow enough such that air-gap openings are pinched off in the initial stages of the cap deposition hence sealing the air-gap and avoiding cap deposition in the air-gaps. Examples of such cap material comprise but are not limited to CVD SiC, CVD SiCN.

Figure 8:
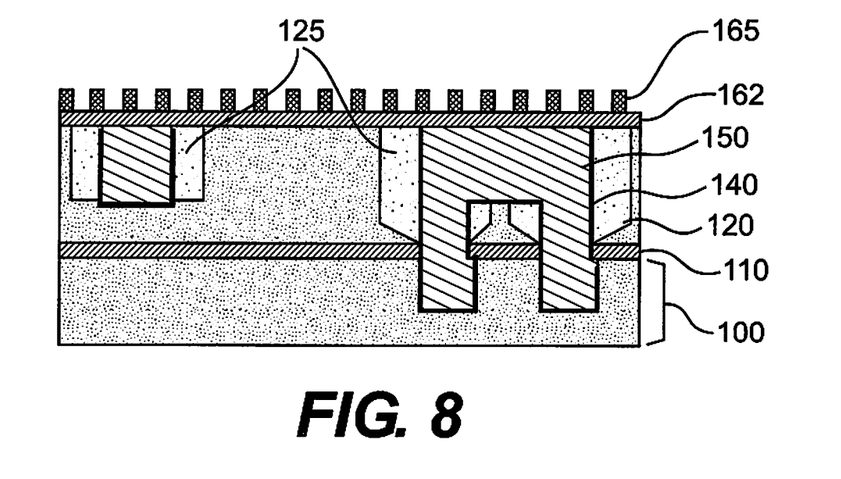
FIG. 8. comprises an article of manufacture showing a second embodiment of the present invention in which a damaged ILD is too wide for efficient pinch-off of the cap, but subsequently remedied according to the present invention.

The second embodiment is for the scenario where the gap is too wide for the cap deposition to be able to pinch off without either depositing significant amount of the cap level, typically of a higher dielectric constant, or causing topography issues for the next level. In such cases, as seen in FIG. 8, the damaged ILD region, 125, is wide. In this embodiment, a first cap layer, 162, is deposited immediately after a chemical-mechanical polish step.

Figure 9:
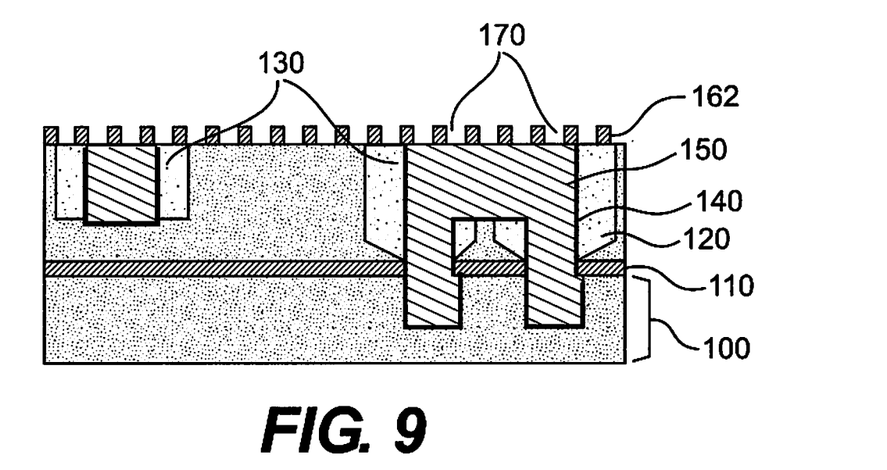
FIG. 9. comprises an article of manufacture showing a second embodiment of the present invention and illustrates a structure showing post gap patterning and extraction to leave air-gaps in the structure of FIG. 8 according to the present invention.

The cap is subsequently patterned with either a self-assembled non-lithographic patterning layer 165 described by Colburn et al. in U.S. Pat. No. 6,911,400 or by lithographic techniques such that narrow gap or gaps are formed right over the damaged regions 125. The structure shown in FIG. 8 represents the former case. Now referring to FIG. 9, Gaps 170, are formed in the cap layer 162 by using a suitable etch process to transfer the patterns in 165 into the cap layer 162. This is followed by an appropriate ashing process to remove the residual patterning layer 165. The wet extraction process outlined in the original embodiment of this invention is used to form air-gaps 130. This time the damaged dielectric regions are extracted out of the structure through the gaps 170 in cap layer 162.

One aspect of the invention comprises a dual damascene article of manufacture that includes a trench containing a conductive metal column, the trench and the conductive metal column extending down into and contiguous with a via, the trench and the conductive metal column and the via having a common axis, wherein the trench further comprises a sidewall air-gap immediately adjacent the side walls of the trench and the conductive metal column, the sidewall air-gap extending down to the via to a depth below a line fixed by the bottom of the trench, and continues downward in the via for a distance of from about 1 Angstrom below the line to the full depth of the via. In a further embodiment the width of the air-gap can vary from about 1 angstrom to about the largest diameter of the trench, or the air-gap comprises an air gap no larger than about 0.5 microns. Further in this regard, and in another embodiment of the invention, the air-gap varies from about 1 Angstrom below the trench to the entire depth of the via.

Another aspect of the invention comprises a dual damascene article of manufacture that includes a trench containing a conductive metal column, the trench and the conductive metal column extending down into and contiguous with a via, the trench and the conductive metal column and the via having a common axis, wherein the trench further comprises a sidewall air-gap immediately adjacent the side walls of the trench and the conductive metal column, the sidewall air-gap extending down to the via, wherein the width of the sidewall air-gap varies from about 1 Angstrom to about 1000 Angstroms, and the via does not have a sidewall air-gap.

various embodiments of our invention also comprise inter alia a process for manufacturing a dual damascene article of manufacture comprising a trench and a conductive metal column, the trench and the conductive metal column extending down into and contiguous with a via, the trench and the conductive metal column and the via having a common axis, wherein the trench and the via further comprise a sidewall air gap adjacent the side walls of the trench, the via, and the conductive metal column, the sidewall air-gap extending down to the via to a depth below a line fixed by the bottom of the trench, and continues downward in the via for a distance of from about 1 Angstrom below the line to the full depth of the via, the air gap being on opposite sides of the trench and the via, the process comprising forming the trench and the via of the dual damascene article of manufacture, coating the side wall of the trench and the side wall of the via with a dielectric material the dielectric material being on opposite sides of the trench and the via, damaging the dielectric material to form a damaged dielectric material on the side wall of the trench and the side wall of the via, metallizing the trench and the via having the damaged dielectric material to form a conductive metal column in the trench and a conductive metal column in the via and separately forming a metallization liner material in the trench and the via whereby the metallization liner is on opposite sides of the conductive metal column and contiguous with and interposed between the conductive metal column and the dielectric material, and removing the damaged dielectric material to form a sidewall air-gap adjacent the side wall, wherein the air gap is contiguous with the metallization liner and the metallization liner is contiguous with the conductive metal column, and further comprising providing a perforated pinched off cap operatively associated with the article, the perforated pinched off cap comprising a first cap layer patterned with a patterning layer that defines a narrower gap or narrower gaps extending from the top surface of the first cap layer to the bottom surface of the first cap layer, with the narrower gap or narrower gaps extending through the bottom surface of the first cap layer and being positioned over and projecting into the sidewall air-gap, and sealing only the narrower gap or narrower gaps, and further providing a second non-perforated cap layer operatively associated with and extending over the top surface of the first cap layer. This process may further include cap and ILD deposition and pinch-off of the sidewall air-gaps during the ILD deposition, with this ILD deposition comprising a next level ILD deposition wherein the air-gap formation is first followed by the cap deposition and then by the next level ILD deposition.

Other embodiments of our invention also comprise inter alia a process for manufacturing a dual damascene article of manufacture comprising a trench containing a conductive metal column the trench and the conductive metal column extending down into and contiguous with a via, the trench and the conductive metal column and the via having a common axis, wherein the trench further comprises a sidewall air-gap immediately adjacent the side walls of the trench and the conductive metal column, the sidewall air-gap extending down to the via, wherein the width of the sidewall air-gap varies from about 1 Angstrom to about 1000 Angstroms, and the via does not have a sidewall air-gap, comprising forming the trench and the via of the dual damascene article of manufacture, placing gap fill material in the via, coating the side wall of the trench with a dielectric material on opposite sides of the trench, damaging the dielectric material to form a damaged dielectric material on the side wall of the trench on opposite sides of the trench, removing the gap fill material from the via, metallizing the trench having the damaged dielectric material and metallizing the via to form a conductive metal column in the trench and a conductive metal column in the via, and separately forming a metallization liner material in the trench and the via whereby the metallization liner is on opposite sides of and contiguous with and interposed between the conductive metal column and the damaged dielectric material, and removing the damaged dielectric material from the trench to form a sidewall air-gap immediately adjacent the side wall and the metallization liner in the trench, wherein the air gap is contiguous with the metallization liner and the metallization liner is contiguous with the conductive metal column, and further comprising providing a perforated pinched off cap operatively associated with the article, the perforated pinched off cap comprising a first cap layer patterned with a patterning layer that defines a narrower gap or narrower gaps extending from the top surface of the first cap layer to the bottom surface of the first cap layer, with the narrower gap or narrower gaps extending through the bottom surface of the first cap layer and being positioned over and projecting into the sidewall air-gap, and sealing only the narrower gap or narrower gaps, and further providing a second non-perforated cap layer operatively associated with and extending over the top surface of the first cap layer.

Other embodiments of our invention comprise inter alia a process for manufacturing a capped dual damascene article of manufacture comprising a trench and a via containing a conductive metal column the trench and the conductive metal column extending down into and contiguous with the via, the trench and the conductive metal column and the via having a common axis, wherein the trench and the via further comprise a sidewall air-gap immediately adjacent the side walls of the trench, the via, and the conductive metal column, and on opposite sides of the trench, and the via, and the conductive metal column, the sidewall air-gap extending down to the via to a depth below a line fixed by the bottom of the trench, and continues downward in the via for a distance of from about 1 Angstrom below the line to the full depth of the via, and further comprising a perforated pinched off cap operatively associated with the article, the process comprising forming a trench and a via in the dual damascene article of manufacture, coating the side wall of the trench and the side wall of the via with a dielectric material on opposite sides of the trench and the via, damaging the dielectric material to form a damaged dielectric material on the side wall of the trench and the side wall of the via and on opposite sides of the trench and the via, metallizing the trench and the via having the damaged dielectric material to form a conductive metal column in the trench and a conductive metal column in the via and separately forming a metallization liner material in the trench and the via whereby the metallization liner is contiguous with the conductive metal column and interposed between the conductive metal column and the dielectric material, and on opposite sides of the metal column, wherein the air gap is contiguous with the metallization liner and the metallization liner is contiguous with the conductive metal column, placing a first cap over the trench having a conductive metal column and the via having a conductive metal column, patterning holes in the first cap to provide a hole pattern and forming holes through the hole pattern, removing the damaged dielectric material through the holes to form a sidewall air-gap adjacent the side wall and the metallization liner and the conductive metal column in the trench and the via, forming a second cap on top of the first cap, and pinching off the sidewall air-gap during the formation of the second cap, and further comprising providing a perforated pinched off cap operatively associated with the article, the perforated pinched off cap comprising a first cap layer patterned with a patterning layer that defines a narrower gap or narrower gaps extending from the top surface of the first cap layer to the bottom surface of the first cap layer, with the narrower gap or narrower gaps extending through the bottom surface of the first cap layer and being positioned over and projecting into the sidewall air-gap, and sealing only the narrower gap or narrower gaps, and further providing a second non-perforated cap layer operatively associated with and extending over the top surface of the first cap layer.

Other embodiments of our invention comprises inter alia a process for manufacturing a capped dual damascene article of manufacture comprising a via and a trench containing a conductive metal column, the trench, the via, and the conductive metal column having a common axis, wherein the trench further comprises a sidewall air-gap immediately adjacent only to the side walls of the trench and the conductive metal column, and further comprising a perforated pinched off cap operatively associated with the article, the process comprising forming a trench and a via in the dual damascene article of manufacture, coating the side wall of the trench with a dielectric material on opposite sides of the trench, damaging the dielectric material to form a damaged dielectric material on the side wall of the trench and on opposite sides of the trench, metallizing the trench having the damaged dielectric material and the via to form a conductive metal column in the trench and the via and separately forming a metallization liner material in the trench and the via whereby the metallization liner is on opposite sides of the conductive metal column and contiguous with and interposed between the conductive metal column and the dielectric material, wherein the air gap is contiguous with the metallization liner and the metallization liner is contiguous with the conductive metal column, placing a first cap over the trench having a conductive metal column, patterning holes in the first cap to provide a hole pattern and forming holes through the hole pattern, removing the damaged dielectric material through the holes to form a sidewall air-gap on opposite sides of the trench and immediately adjacent the side wall and the metallization liner in the trench, forming a second cap on top of the first cap, and pinching off the sidewall air-gap during the formation of the second cap, and further comprising providing a perforated pinched off cap operatively associated with the article, the perforated pinched off cap comprising a first cap layer patterned with a patterning layer that defines a narrower gap or narrower gaps extending from the top surface of the first cap layer to the bottom surface of the first cap layer, with the narrower gap or narrower gaps extending through the bottom surface of the first cap layer and being positioned over and projecting into the sidewall air-gap, and sealing only the narrower gap or narrower gaps, and further providing a second non-perforated cap layer operatively associated with and extending over the top surface of the first cap layer.

Any of the foregoing processes of paragraphs [048.3] to [048.6] may further comprise damaging the line and via dielectrics by a process comprising aggressive plasma based strip chemistries based on gases selected from $0_2$, $N_2$, $H_2$, $CO_2$, CO, $H_2O$, and $C_xH_yF_z$ where x, y and z comprise integers that vary from 0 to about 4; removal of the damaged dielectric material by wet chemistries comprising acidic chemistries or basic chemistries, wherein the acidic chemistries comprise dilute or concentrated HF, and the basic chemistries comprise $NH_4OH$ chemistries.

Any of the foregoing processes of paragraphs [048.3] to [048.6] may further comprise patterning the cap with a lithographic template to form holes or perforations over the damaged layer immediate adjacent the conductive metal column, removing the removable regions to form openings above the damaged layer, and removing the damaged layer to form the sidewall air-gap.

Figure 10:
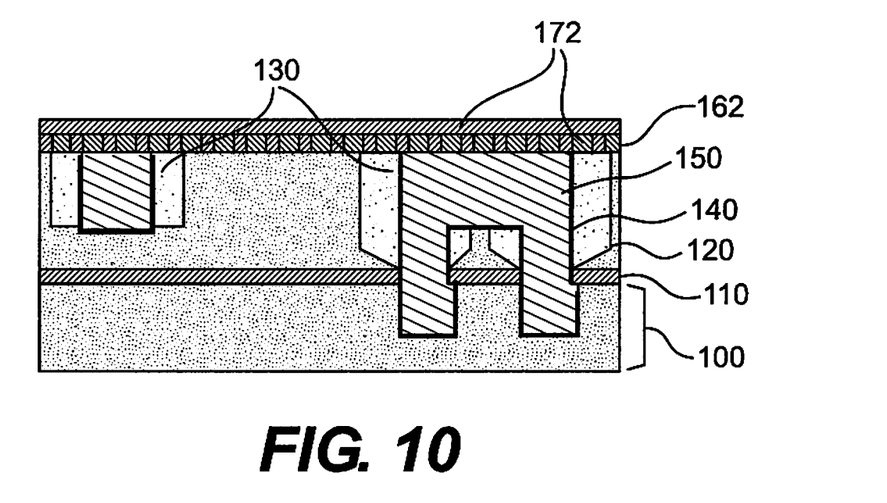
FIG. 10. comprises an article of manufacture showing a second embodiment of the present invention comprising the final structure of a dual damascene air-gap level formed using the article of FIG. 9 according to the present invention.

The air-gap 130 formation is followed with deposition of a second cap, 172 as shown in FIG. 10. The gaps 170 are of appropriate dimensions such that pinch-off of the cap layer 172 is obtained hence sealing the previously formed air-gaps 130 thereby producing the final structure for the second embodiment. This may be repeated at other levels to form multilevel dual damascene air-gap levels.

Throughout this specification, and the drawings the inventors have set out equivalents, including without limitation, equivalent elements, materials, compounds, compositions, conditions, processes, structures and the like, and even though set out individually, also comprise combinations of these equivalents such as the two component, three component, or four component combinations, or more as well as combinations of such equivalent elements, materials, compounds, compositions conditions, processes, structures and the like in any ratios.

Additionally, the various numerical ranges describing the invention as set forth throughout the specification also comprises any combination of the lower ends of the ranges with the higher ends of the ranges, and any single numerical value, or any single numerical value that will reduce the scope of the lower limits of the range or the scope of the higher limits of the range, and ranges falling within any of these ranges.

The term "about" or "substantially" as applied to any claim or any parameters herein, such as a numerical value, including values used to describe numerical ranges, means slight variations in the parameter. In another embodiment, the terms "about," "substantial," or "substantially," when employed to define numerical parameter comprise, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit of zero or a miniscule number, e.g., 0.001. The terms "about," "substantial" and "substantially" mean that which is largely or for the most part entirely specified. The inventors also employ the terms "substantial," "substantially," and "about" in the same way as a person with ordinary skill in the art would understand them or employ them. The terms "written description," "specification," "claims," "drawings," and "abstract" as used herein refer to the written description, specification, claims, drawings, and abstract of the present application as originally filed and as subsequently amended. We intend the term "diblock copolymer" as used in the written description and the claims to also comprise triblock copolymers, and block copolymers containing four or five or more block units.

All scientific journal articles and other articles as well as issued and pending patents that this written description mentions including the references cited in such scientific journal articles and other articles, and such patents, are incorporated herein by reference in their entirety for the purpose cited in this written description and for all other disclosures contained in such scientific journal articles and other articles as well as patents and the aforesaid references cited therein, as all or any one may bear on or apply in whole or in part, not only to this written description, but also the abstract, claims, and appended drawings of this application.

Although the inventors have described their invention by reference to some embodiments, other embodiments defined by the doctrine of equivalents are intended to be included as falling within the broad scope and spirit of the foregoing written description, drawings, abstract of the disclosure, and claims as originally presented or subsequently amended.

We claim:

1. A process for manufacturing a dual damascene article of manufacture comprising a trench and a conductive metal column, said trench and said conductive metal column extending down into and contiguous with a via, said trench and said conductive metal column and said via having a common axis, wherein said trench and said via further comprise a sidewall air gap adjacent the side walls of said trench, said via, and said conductive metal column, said sidewall air-gap extending down to said via to a depth below a line fixed by the bottom of said trench, and continues downward in said via for a distance of from about 1 Angstrom below said line to the full depth of said via, said air gap being on opposite sides of said trench and said via, said process comprising forming said trench and said via of said dual damascene article of manufacture, coating the side wall of said trench and the side wall of said via with a dielectric material said dielectric material being on opposite sides of said trench and said via, damaging said dielectric material to form a damaged dielectric material on said side wall of said trench and said side wall of said via, metallizing said trench and said via having said damaged dielectric material to form a conductive metal column in said trench and a conductive metal column in said via and separately forming a metallization liner material in said trench and said via whereby said metallization liner is on opposite sides of said conductive metal column and contiguous with and interposed between said conductive metal column and said dielectric material, and removing said damaged dielectric material to form a sidewall air-gap adjacent said side wall, wherein said air gap is contiguous with said metallization liner and said metallization liner is contiguous with said conductive metal column, and further comprising providing a perforated pinched off cap operatively associated with said article, said perforated pinched off cap comprising a first cap layer patterned with a patterning layer that defines a narrower gap or narrower gaps extending from the top surface of said first cap layer to the bottom surface of said first cap layer, with said narrower gap or narrower gaps extending through said bottom surface of said first cap layer and being positioned over and projecting into said sidewall air-gap, and sealing only said narrower gap or narrower gaps, and further providing a second non-perforated cap layer operatively associated with and extending over said top surface of said first cap layer.

2. A process for manufacturing a dual damascene article of manufacture comprising a trench containing a conductive metal column said trench and said conductive metal column extending down into and contiguous with a via, said trench and said conductive metal column and said via having a common axis, wherein said trench further comprises a sidewall air-gap immediately adjacent the side walls of said trench and said conductive metal column, said sidewall air-gap extending down to said via, wherein the width of said sidewall air-gap varies from about 1 Angstrom to about 1000 Angstroms, and said via does not have a sidewall air-gap, comprising forming said trench and said via of said dual damascene article of manufacture, placing gap fill material in said via, coating the side wall of said trench with a dielectric material on opposite sides of said trench, damaging said dielectric material to form a damaged dielectric material on said side wall of said trench on opposite sides of said trench, removing said gap fill material from said via, metallizing said trench having said damaged dielectric material and metallizing said via to form a conductive metal column in said trench and a conductive metal column in said via, and separately forming a metallization liner material in said trench and said via whereby said metallization liner is on opposite sides of and contiguous with and interposed between said conductive metal column and said damaged dielectric material, and removing said damaged dielectric material from said trench to form a sidewall air-gap immediately adjacent said side wall and said metallization liner in said trench, wherein said air gap is contiguous with said metallization liner and said metallization liner is contiguous with said conductive metal column, and further comprising providing a perforated pinched off cap operatively associated with said article, said perforated pinched off cap comprising a first cap layer patterned with a patterning layer that defines a narrower gap or narrower gaps extending from the top surface of said first cap layer to the bottom surface of said first cap layer, with said narrower gap or narrower gaps extending through said bottom surface of said first cap layer and being positioned over and projecting into said sidewall air-gap, and sealing only said narrower gap or narrower gaps, and further providing a second non-perforated cap layer operatively associated with and extending over said top surface of said first cap layer.

3. A process for manufacturing a capped dual damascene article of manufacture comprising a trench and a via containing a conductive metal column said trench and said conductive metal column extending down into and contiguous with said via, said trench and said conductive metal column and said via having a common axis, wherein said trench and said via further comprise a sidewall air-gap immediately adjacent the side walls of said trench, said via, and said conductive metal column, and on opposite sides of said trench, and said via, and said conductive metal column, said sidewall air-gap extending down to said via to a depth below a line fixed by the bottom of said trench, and continues downward in said via for a distance of from about 1 Angstrom below said line to the full depth of said via, and further comprising a perforated pinched off cap operatively associated with said article, the process comprising forming a trench and a via in said dual damascene article of manufacture, coating the side wall of said trench and the side wall of said via with a dielectric material on opposite sides of said trench and said via, damaging said dielectric material to form a damaged dielectric material on said side wall of said trench and said side wall of said via and on opposite sides of said trench and said via, metallizing said trench and said via having said damaged dielectric material to form a conductive metal column in said trench and a conductive metal column in said via and separately forming a metallization liner material in said trench and said via whereby said metallization liner is contiguous with said conductive metal column and interposed between said conductive metal column and said dielectric material, and on opposite sides of said metal column, wherein said air gap is contiguous with said metallization liner and said metallization liner is contiguous with said conductive metal column, placing a first cap over said trench having a conductive metal column and said via having a conductive metal column, patterning holes in said first cap to provide a hole pattern and forming holes through said hole pattern, removing said damaged dielectric material through said holes to form a sidewall air-gap adjacent said side wall and said metallization liner and said conductive metal column in said trench and said via, forming a second cap on top of said first cap, and pinching off said sidewall air-gap during the formation of said second cap, and further comprising providing a perforated pinched off cap operatively associated with said article, said perforated pinched off cap comprising a first cap layer patterned with a patterning layer that defines a narrower gap or narrower gaps extending from the top surface of said first cap layer to the bottom surface of said first cap layer, with said narrower gap or narrower gaps extending through said bottom surface of said first cap layer and being positioned over and projecting into said sidewall air-gap, and sealing only said narrower gap or narrower gaps, and further providing a second non-perforated cap layer operatively associated with and extending over said top surface of said first cap layer.

4. A process for manufacturing a capped dual damascene article of manufacture comprising a via and a trench containing a conductive metal column, said trench, said via, and said conductive metal column having a common axis, wherein said trench further comprises a sidewall air-gap immediately adjacent only to the side walls of said trench and said conductive metal column, and further comprising a perforated pinched off cap operatively associated with said article, said process comprising forming a trench and a via in said dual damascene article of manufacture, coating the side wall of said trench with a dielectric material on opposite sides of said trench, damaging said dielectric material to form a damaged dielectric material on said side wall of said trench and on opposite sides of said trench, metallizing said trench having said damaged dielectric material and said via to form a conductive metal column in said trench and said via and separately forming a metallization liner material in said trench and said via whereby said metallization liner is on opposite sides of said conductive metal column and contiguous with and interposed between said conductive metal column and said dielectric material, wherein said air gap is contiguous with said metallization liner and said metallization liner is contiguous with said conductive metal column, placing a first cap over said trench having a conductive metal column, patterning holes in said first cap to provide a hole pattern and forming holes through said hole pattern, removing said damaged dielectric material through said holes to form a sidewall air-gap on opposite sides of said trench and immediately adjacent said side wall and said metallization liner in said trench, forming a second cap on top of said first cap, and pinching off said sidewall air-gap during the formation of said second cap, and further comprising providing a perforated pinched off cap operatively associated with said article, said perforated pinched off cap comprising a first cap layer patterned with a patterning layer that defines a narrower gap or narrower gaps extending from the top surface of said first cap layer to the bottom surface of said first cap layer, with said narrower gap or narrower gaps extending through said bottom surface of said first cap layer and being positioned over and projecting into said sidewall air-gap, and sealing only said narrower gap or narrower gaps, and further providing a second non-perforated cap layer operatively associated with and extending over said top surface of said first cap layer.

5. The process of claim 1 further including cap and ILD deposition and pinch-off of said sidewall air-gaps during said ILD deposition, said ILD deposition comprising a next level ILD deposition wherein said air-gap formation is first followed by said cap deposition and then by said next level ILD deposition.

6. The process of any one of claims 1 to 3 comprising damaging said line and via dielectrics by a process comprising aggressive plasma based strip chemistries based on gases selected from $O_2$, $N_2$, $H_2$, $CO_2$, CO, $H_2O$, and $C_xH_yF_z$ where x, y and z comprise integers that vary from 0 to about 4.

7. The process of any one of claims 1 to 4 comprising removal of said damaged dielectric material by wet chemistries comprising acidic chemistries or basic chemistries.

8. The process of claim 6 comprising removal of said damaged dielectric material by wet chemistries comprising acidic chemistries or basic chemistries.

9. The process of claim 7 wherein said acidic chemistries comprise dilute or concentrated HF, and said basic chemistries comprise $NH_4OH$ chemistries.

10. The process of claim 8 wherein said acidic chemistries comprise dilute or concentrated HF, and said basic chemistries comprise $NH_4OH$ chemistries.

11. The process of one of claim 3 or 4 comprising patterning said cap with a lithographic template to form holes or perforations over said damaged layer immediate adjacent said conductive metal column, removing said removable regions to form openings above said damaged layer, and removing said damaged layer to form said sidewall air-gap.

* * * * *